(12) United States Patent
Lim et al.

(10) Patent No.: US 7,868,433 B2
(45) Date of Patent: Jan. 11, 2011

(54) LOW STRESS CAVITY PACKAGE

(75) Inventors: Peng Soon Lim, Melaka (MY); Shee Min Yeong, Melaka (MY); You Chye How, Melaka (MY)

(73) Assignee: National Semiconductor Corporation, Santa Clara, CA (US)

( * ) Notice: Subject to any disclaimer, the term of this patent is extended or adjusted under 35 U.S.C. 154(b) by 309 days.

(21) Appl. No.: 12/202,112

(22) Filed: Aug. 29, 2008

(65) Prior Publication Data
US 2010/0052123 A1 Mar. 4, 2010

(51) Int. Cl.
*H01L 23/495* (2006.01)
(52) U.S. Cl. .......... 257/676; 257/E21.51; 257/E23.037; 438/123
(58) Field of Classification Search .......... 438/123; 257/676, E21.51, E23.037
See application file for complete search history.

(56) References Cited

U.S. PATENT DOCUMENTS

| 6,476,885 | B1 | 11/2002 | Murray et al. |
| 6,933,605 | B2 | 8/2005 | Tao et al. |
| 7,015,587 | B1 | 3/2006 | Poddar |
| 7,205,095 | B1 | 4/2007 | Prabhu et al. |
| 2002/0031865 | A1* | 3/2002 | Chen et al. ................ 438/123 |
| 2002/0056905 | A1* | 5/2002 | Miyaki et al. ............. 257/692 |
| 2008/0315382 | A1* | 12/2008 | Wallace .................... 257/676 |

OTHER PUBLICATIONS

U.S. Appl. No. 11/048,309, filed Jan. 31, 2005.
U.S. Appl. No. 10/953,002, filed Sep. 28, 2004.
U.S. Appl. No. 11/836,662, filed Aug. 9, 2007.
U.S. Appl. No. 10/969,729, filed Oct. 19, 2004.

* cited by examiner

*Primary Examiner*—Trung Dang
(74) *Attorney, Agent, or Firm*—Beyer Law Group LLP

(57) ABSTRACT

The present invention relates to methods and arrangements for forming a low stress cavity package. Particular methods may be performed with existing packaging equipment. In one such method, a leadframe laminated with adhesive film is provided. Integrated circuit dice are connected to the leadframe by reflowing solder between bond pads on the active surface of each die and the leadframe. A viscous thermosetting material is dispensed around the periphery of the active surface of each die. The thermosetting material fills gaps between the solder joint connections and the adhesive film. As a result, the thermosetting material, solder joint connections, each integrated circuit die and the adhesive film define and seal a protective cavity between the active surface of the die and the adhesive film. Portions of each die, leads, solder joint connections and adhesive film are encapsulated with a molding material that is prevented from entering the sealed cavity.

14 Claims, 5 Drawing Sheets

LOW STRESS CAVITY PACKAGE

FIELD OF THE INVENTION

The present invention relates generally to the packaging of integrated circuits (ICs). More particularly, the invention relates to packages that include low stress cavities.

BACKGROUND OF THE INVENTION

There are a number of conventional processes for packaging integrated circuit (IC) dice. By way of example, many IC packages utilize a metallic leadframe that has been stamped or etched from a metal sheet to provide electrical interconnects to external devices. The die may be electrically connected to the leadframe by means of bonding wires, solder bumps or other suitable electrical connections. In general, the die and portions of the leadframe are encapsulated with a molding material to protect the delicate electrical components on the active side of the die while leaving selected portions of the leadframe exposed to facilitate electrical connections to external devices.

During testing as well as typical operation, packages may be repeatedly exposed to temperature cycling and other environmental stresses. Stresses tend to concentrate in regions of the package where materials with different coefficients of thermal expansion meet, such as the interface between the die and the surrounding molding material. Such stresses may lead to damage to the electrical connections and damage to the die itself, as well as other problems, and may render the device inoperable or at least adversely affect the performance of the device.

Semiconductor manufacturers have added various features, such as cavities and lids, to certain types of IC packages in order to better protect the integrated circuit dice within the packages. These features, however, may entail higher costs and/or require the use of specialized packaging equipment. Although existing approaches have worked well in certain applications, there are continuing efforts to develop more reliable and efficient methods and apparatuses.

SUMMARY OF THE INVENTION

The present invention relates to methods and arrangements for forming integrated circuit packages with low stress cavities. Particular methods may be mostly or entirely performed with existing packaging equipment. In one such method, a leadframe laminated with adhesive film is provided. Integrated circuit dice are physically and electrically connected to the leadframe by reflowing solder that is positioned between bond pads on the active surface of each die and associated leads on the leadframe. A viscous thermosetting material is dispensed around the periphery of the active surface of each die. The thermosetting material fills gaps between the solder joint connections and the adhesive film. As a result, the thermosetting material, solder joint connections, each integrated circuit die and the adhesive film define a cavity between the active surface of the die and the adhesive film. The cavity helps protect portions of the active surface of the die from damage. The leads, solder joint connections, adhesive film and portions of each die are encapsulated with a molding material that is substantially prevented from entering the cavity. Some embodiments of the present invention pertain to semiconductor packages that result from the aforementioned operations.

BRIEF DESCRIPTION OF THE DRAWINGS

The invention and the advantages thereof, may best be understood by reference to the following description taken in conjunction with the accompanying drawings in which.

In the drawings, like reference numerals are sometimes used to designate like structural elements. It should also be appreciated that the depictions in the figures are diagrammatic and not to scale.

DETAILED DESCRIPTION OF THE PREFERRED EMBODIMENTS

The present invention relates generally to the packaging of integrated circuits. More particularly, the invention relates to improved, and generally low-cost, methods and arrangements for forming a low stress package having a cavity.

As noted earlier, when a die is encapsulated in molding material, stresses can build up due to various differences in coefficients of thermal expansion. Various structures, such as lids, are currently used to better protect the active side of a die within a semiconductor package. Adding lids to a semiconductor package, however, may require the use of specialized packaging equipment. Some embodiments of the present invention minimize or eliminate the need for such specialized equipment.

Figure 1:
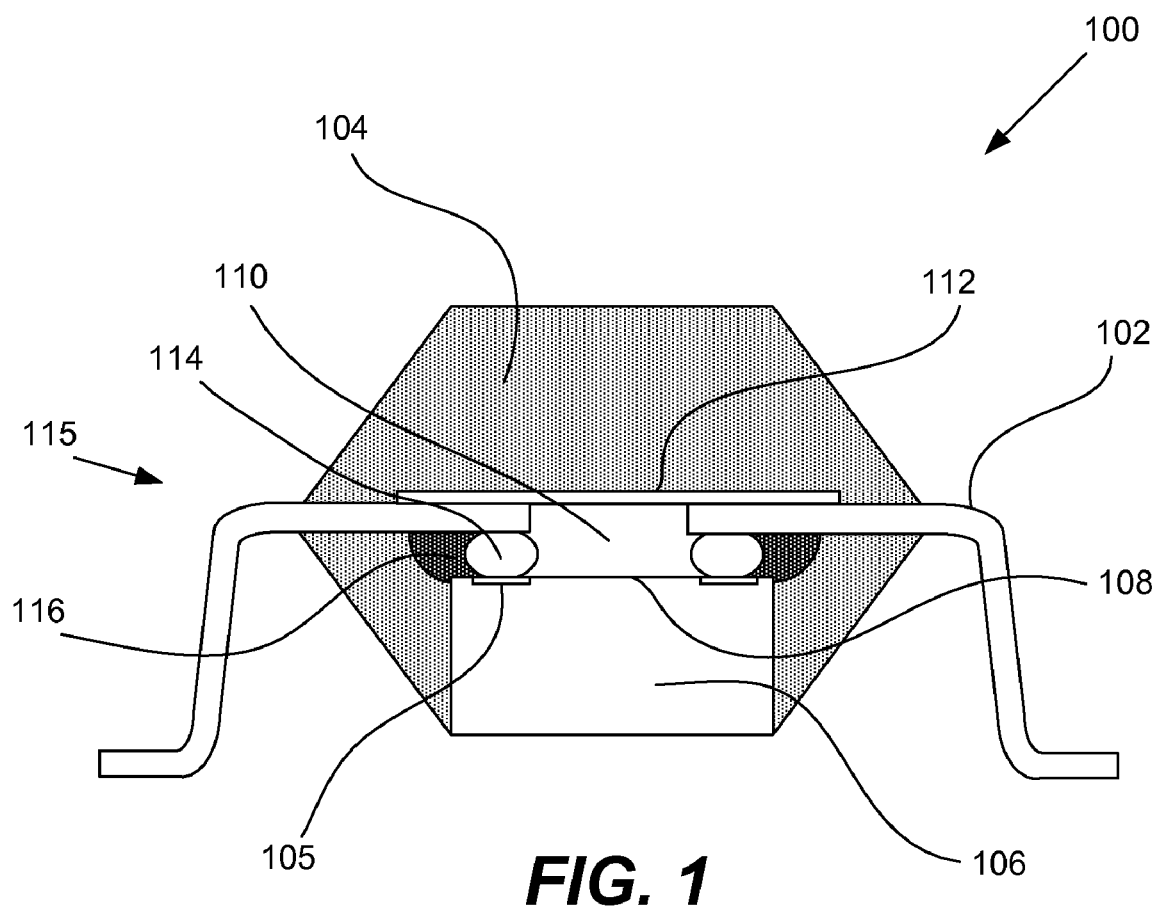
FIG. 1 is a diagrammatic side view of a package having a cavity according to one embodiment of the present invention.

One such embodiment is described with reference to FIG. 1. FIG. 1 diagrammatically illustrates semiconductor package 100 including integrated circuit die 106, adhesive film 112 and leadframe 115 having leads 102. Solder joint connections 114 electrically and physically connect leadframe 115, and particularly leads 102, with bonding pads 105 of die 106. In the illustrated embodiment, a thermosetting material 116, together with the solder joint connections 114, die 106 and adhesive film 112, defines and seals a cavity 110 over a portion of the active surface 108 of the die. Cavity 110 is substantially free of molding material and thus facilitates insulating active surface 108 of the die from stresses resulting from the aforementioned mismatches in coefficients of thermal expansion. Furthermore, cavity 110 may be formed so as to have a cavity pressure (e.g., the pressure of the gas within the cavity) substantially lower than the pressure outside of package 100. As shown in FIG. 2 and FIGS. 3D-3I, the structures illustrated in FIG. 1 can be formed mostly or entirely with existing packaging equipment, thus aiding in minimizing manufacturing costs.

Figure 2:
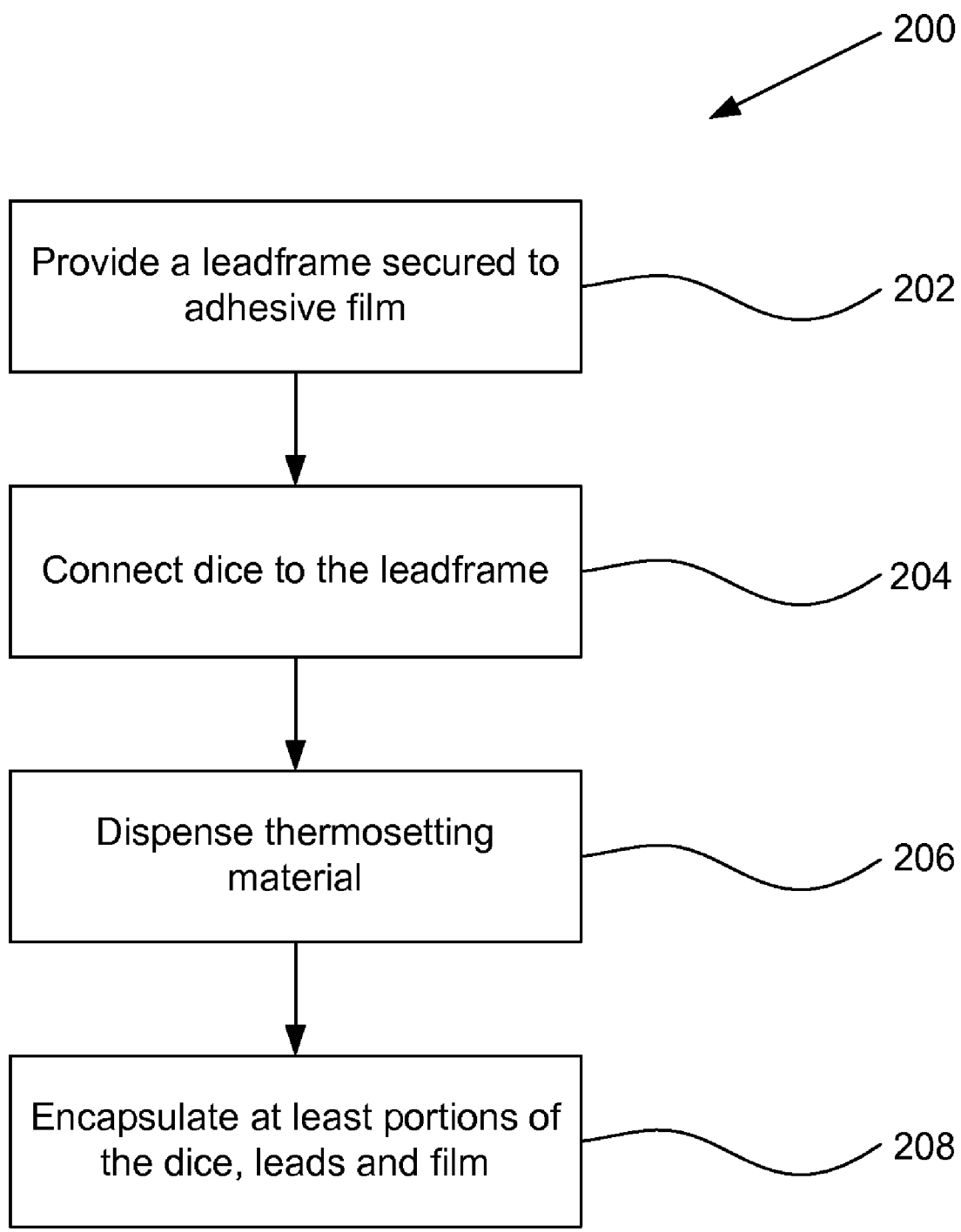
FIG. 2 is a process flow diagram for forming a package with a cavity according to one embodiment of the present invention.
Figure 3A:
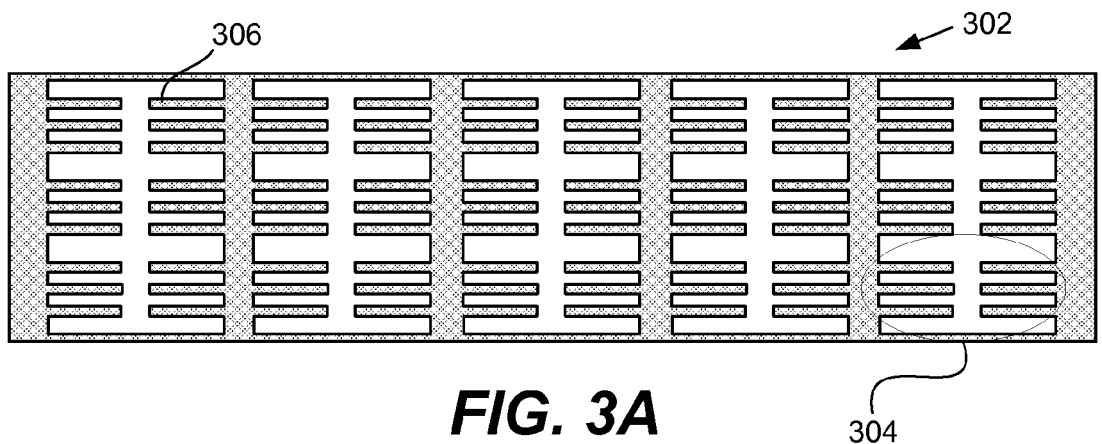
FIGS. 3A-3C diagrammatically illustrate an example method of attaching an adhesive film to a leadframe.
Figure 3B:
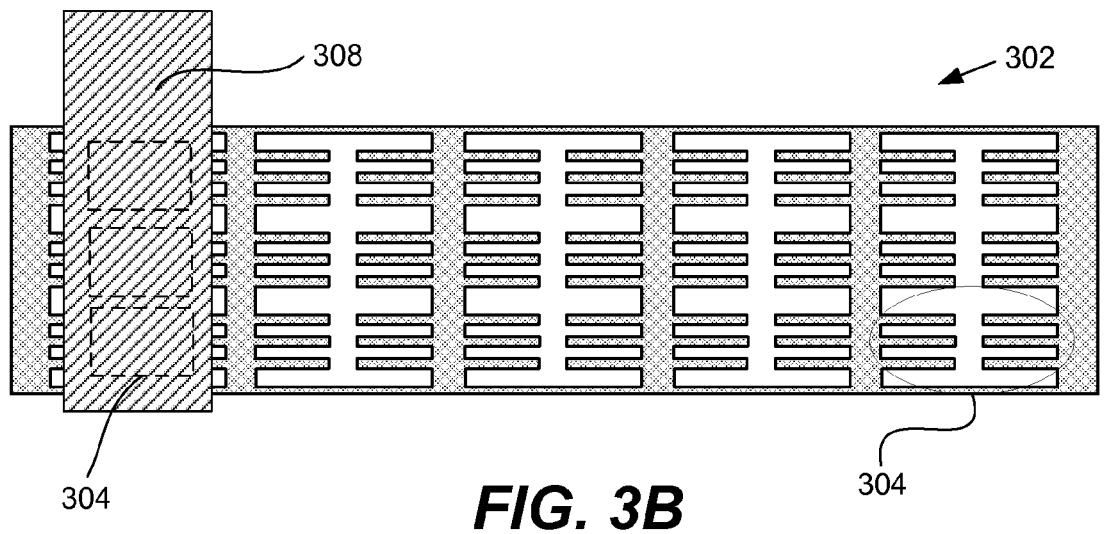
Figure 3C:
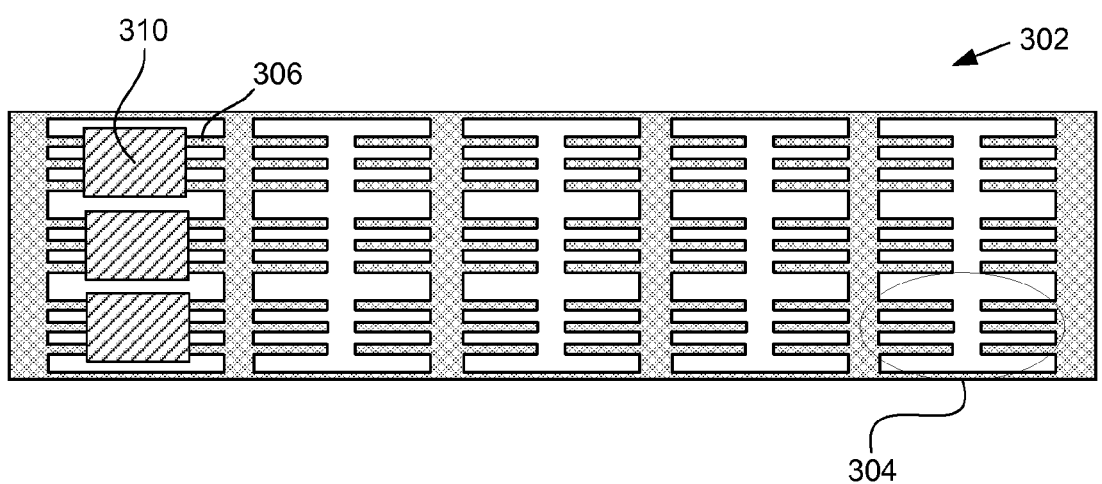

FIG. 2 is a process flow diagram 200 that may be used to form the semiconductor package of FIG. 1 as well as other similar packages. In step 202, a leadframe secured to an adhesive film is provided. The leadframe may be secured to the adhesive film in a variety of ways, depending on the needs of a particular application. In some embodiments of the present invention, the leadframe and adhesive film are arranged and formed as illustrated in FIGS. 3A-3C. In other embodiments, the leadframe and adhesive film may be arranged and secured in different manners.

FIG. 3A illustrates a top view of an example leadframe 302 having device areas 304 and leads 306. Each device area is adapted to receive and electrically connect to an associated integrated circuit die. In the illustrated embodiment, each device area includes leads 306, but lacks a die attach pad. Instead, a gap exists between opposing leads 306 within each device area 304. In alternative embodiments, the leadframe may be structured differently e.g. there may be different numbers or arrangements of leads and device areas.

FIG. 3B shows the application of adhesive film 308 to leadframe 302. The adhesive film 308 may have a variety of properties, depending on the needs of a particular application. By way of example, the film may have a thickness ranging from approximately 50 to 100 microns, although both thinner and thicker thicknesses may be suitable in various alternate embodiments. In some embodiments, the adhesive film 308 is able to tolerate temperatures of up to approximately 250° C. or greater without losing its adhesive properties to a significant degree and without substantial outgassing. The adhesive film 308 may be positioned and laminated, or otherwise applied to the leadframe, using any of a variety of techniques well known in the art. The adhesive film 308, for example, may be applied using a laminating roller and subsequently cut along projected cutting lines 304.

FIG. 3C illustrates the result of such a cutting operation. Individual sections of adhesive film 310 are adhered to a surface of leads 306 such that each individual section of adhesive film is secured to a corresponding device area of leadframe 302. Each individual section of adhesive film 310 is further arranged to bridge a gap between opposing leads within the associated device area and overlie an integrated circuit die that will be later attached to the device area. It should be appreciated that the cutting operation may be performed before, after or substantially simultaneously with the adhering of the film to the leadframe.

Figure 3D:
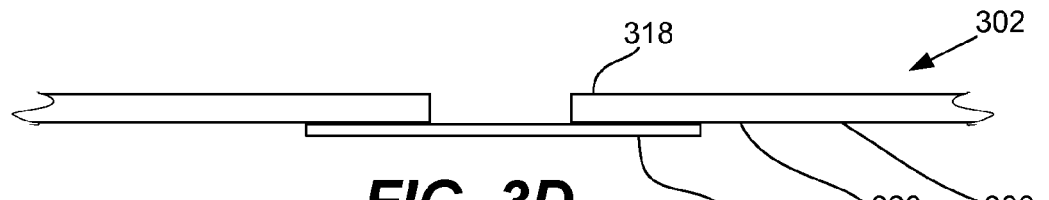
FIGS. 3D-3I diagrammatically illustrate a method of forming a package with a cavity according to one embodiment of the present invention.
Figure 3E:
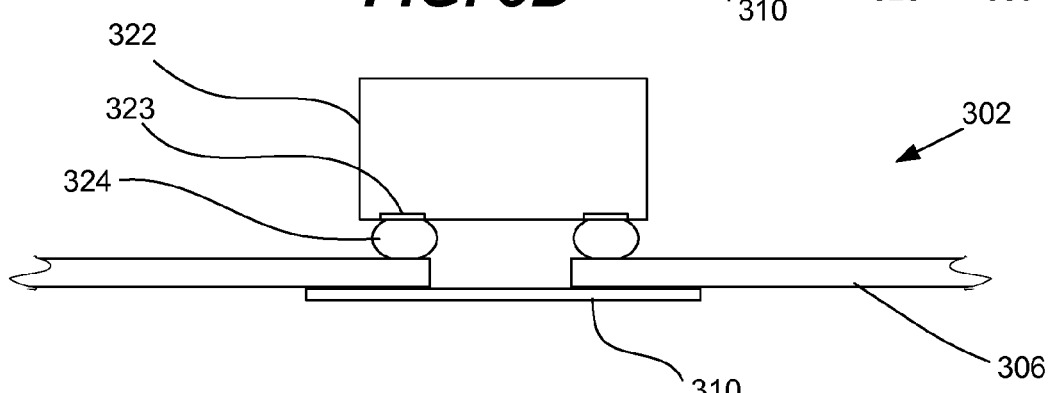

FIG. 3D shows a side view of a leadframe 302 (including leads 306) and adhesive film 310. In the illustrated embodiment, the leadframe and film are flipped relative to the device area 304 of FIG. 3C, although FIG. 3D could also represent a structure formed and arranged in a different manner. Each lead 306 has first surface 318 and second surface 320. Adhesive film 310 is adhered to associated second surfaces 320 of leads 306.

Returning to the process flow diagram of FIG. 2, remaining steps 204, 206 and 208 will be described with reference to FIGS. 3E-3I. In step 204 shown in FIG. 3E, integrated circuit die 322 having bond pads 323 is attached to leadframe 302. In the illustrated embodiment, solder 324 is positioned between the bond pads 323 of integrated circuit die 322 and leads 306. In various embodiments, the solder 324 may take the form of solder balls, solder bumps or a layer of solder paste positioned onto the bonds pads 323 and/or the leads 306. The solder 324 is then reflowed to form solder joints 324 that electrically and physically connect the bond pads 323 to the leads 306.

Figure 3F:
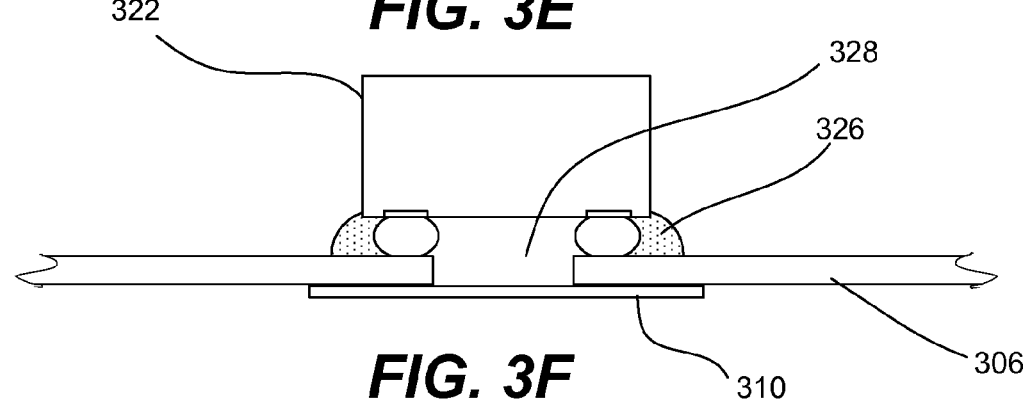
Figure 3G:
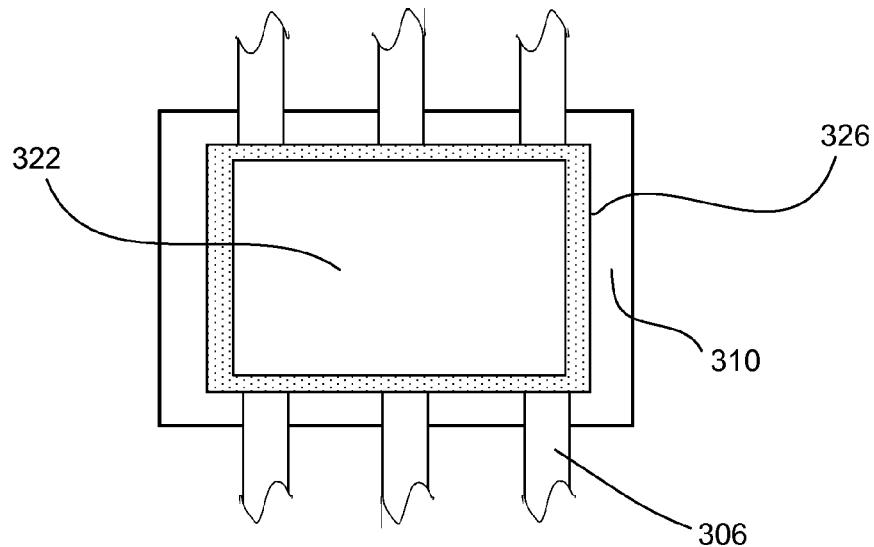

In step 206 shown by FIG. 3F, a viscous material 326 is dispensed around the periphery of die 322. In a particular embodiment, viscous material 326 may be comprised of a thermosetting material. FIG. 3G presents a top view of the structures illustrated in FIG. 3F. FIGS. 3F and 3G show how the viscous material 326 fills in the gaps between the solder joint connections 324, thus sealing in and forming cavity 328 illustrated in FIG. 3F. Viscous material 326, solder joint connections 324, die 322, leadframe 306 and film 310 cooperate to prevent substances, such as molding material, from entering cavity 328 and contacting the delicate circuitry on the active surface of the die.

The properties and features of the cavity 328 and the viscous material 326 may vary depending on the needs of a particular application. A viscous thermosetting material 326, by way of example, may have a viscosity ranging from 86 pascal-seconds to 90 pascal-seconds, although other viscosities may be suitable in alternate embodiments. In some embodiments, the thermosetting material 326 is subsequently hardened through a curing process. By way of example, the curing process may be performed using heat, a chemical reaction, irradiation and/or some other type of curing agent. In certain embodiments, the cavity 328 is sealed with the thermosetting material 326 under an elevated temperature. By way of example, in some embodiments, the cavity 328 may be sealed under an elevated temperature between approximately 165° C. and 185° C. When that temperature declines substantially (e.g., to room temperature), the pressure within the sealed cavity 328 will be significantly lower than the pressure outside the cavity.

Figure 3H:
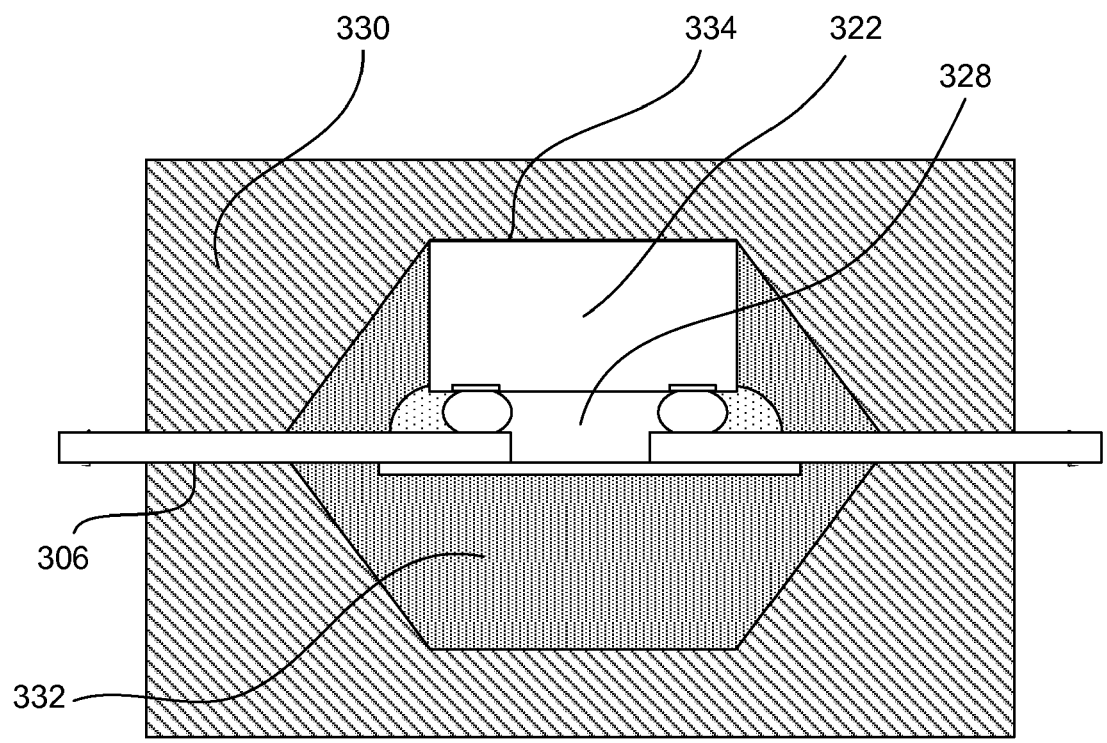

In step 208 of FIG. 2 and FIG. 3H, the structures illustrated in FIGS. 3F and 3G are placed in mold cavity 330 and at least partially encapsulated with molding material 332. FIG. 3H illustrates the partial encapsulation of only one die and associated device area, but those having skill in the art will appreciate that multiple dice and device areas on a leadframe may be, and generally are, encapsulated simultaneously. The molding material 332 is generally a non-conductive plastic having a low coefficient of thermal expansion. The molding material encapsulates at least portions of the die 322, leadframe, adhesive film 310 and thermosetting material 326 but does not enter cavity 328. In the illustrated embodiment, the molding cavity is also designed to keep backside 334 of die 322 free of molding material. The benefits of this optional feature will be described in connection with FIG. 3I.

Figure 3I:
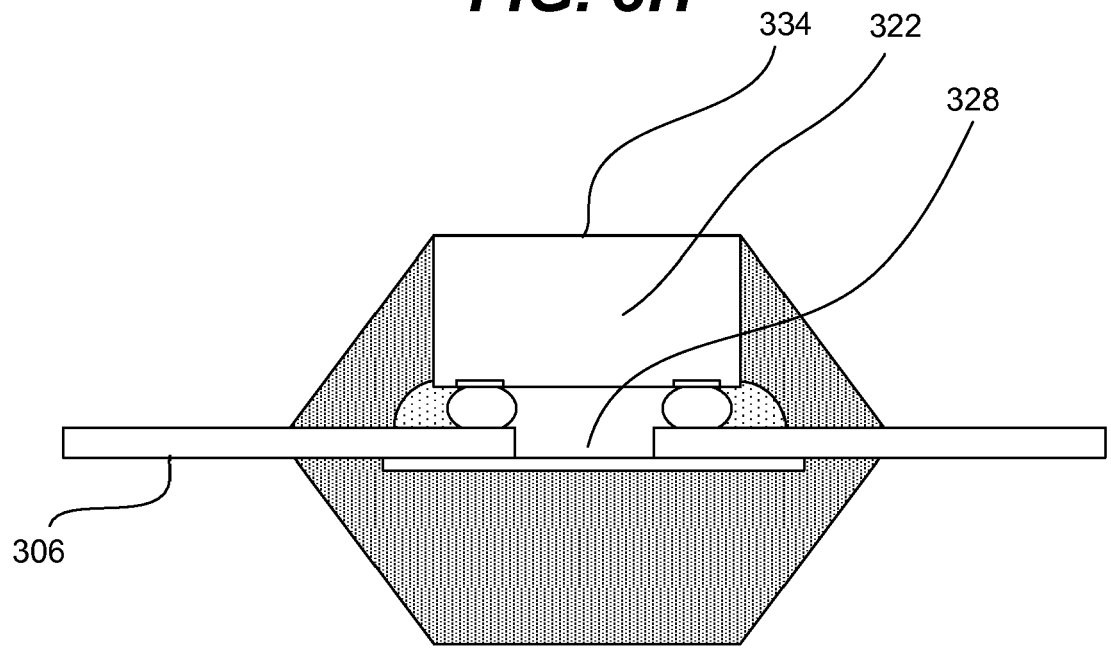

After the encapsulation process illustrated in FIG. 3H, the molded structures are singulated to form individual integrated circuit packages. One such integrated circuit package is shown in FIG. 3I. Because back surface 334 of die 322 is substantially free of molding material, heat dissipation is improved. After or prior to singulation, solder or other metals may be selectively plated onto the back surfaces 334 of the die 322 and leads 306. Additionally, the leads 306 may be shaped into a conventional gull-wing formation, as shown in FIG. 1. The plating and shaping of the leads may facilitate electrical connections between the package and external electrical devices on a printed circuit board.

Although only a few embodiments of the invention have been described in detail, it should be appreciated that the invention may be implemented in many other forms without departing from the spirit or scope of the invention. In the foregoing description, many of the described leadframes include leads and/or contacts, which are frequently referred to herein as leads. In the context of this invention, the term lead is intended to encompass leads, contacts and other electrical interconnect structures that may be present within a leadframe or a leadframe-like structure. Therefore, the present embodiments should be considered as illustrative and not restrictive and the invention is not limited to the details given herein, but may be modified within the scope and equivalents of the appended claims.

What is claimed is:

1. A method for packaging integrated circuit devices, comprising:

providing a leadframe having a number of leads suitable for use in packaging an integrated circuit die, each lead having a first surface arranged for connection with an associated bond pad on an active surface of the die and a second surface opposite the first surface, the second surfaces of the leads being adhesively secured to an adhesive film;

reflowing solder between the first surfaces of selected leads and selected bond pads on the active surface of the die to form solder joint connections that physically and electrically connect the die with the leadframe;

dispensing a viscous thermosetting material substantially around the periphery of the active surface of the die such that the viscous thermosetting material substantially fills any gaps between the solder joint connections between the active surface of the die and the adhesive film, wherein the viscous thermosetting material, the solder joint connections, the active surface of the die and the adhesive film define a cavity between the active surface of the die and the adhesive film that isolates selected regions of the active surface of the die from stresses; and encapsulating at least portions of the die, leads, solder joint connections and the adhesive film with a molding material, wherein the viscous thermosetting material, the active surface of the die and the adhesive film substantially prevent molding material from entering the cavity.

2. The method of claim 1, wherein the thickness of the adhesive film ranges between approximately 50 to 100 microns.

3. The method of claim 1, wherein the adhesive film is adapted to tolerate temperatures of at least approximately 250° C. without losing a substantial degree of adhesiveness.

4. The method of claim 1, wherein the viscosity of the thermosetting material is in the range of approximately 86 pascal-seconds to 90 pascal-seconds.

5. The method of claim 1, wherein the die includes a back surface opposite the active surface, the method further comprising selectively solder plating portions of the back surface of the die and the leadframe to facilitate electrical connections with external devices.

6. The method of claim 1, wherein the encapsulating of at least portions of the die, leads, solder joint connections and the adhesive film includes encapsulating a portion of the integrated circuit die without covering a back surface opposite the active surface of the die such that the back surface of the die is exposed to facilitate heat dissipation.

7. The method of claim 1, wherein the dispensing of the viscous thermosetting material is performed under a temperature at a first elevated level, such that the pressure inside the cavity, after the temperature cools to a second level substantially lower than the first level, is significantly lower than the ambient pressure outside the cavity.

8. An integrated circuit package, comprising:

an integrated circuit die having an active surface and a back surface opposite the active surface, the active surface including a sensitive region;

a plurality of leads, each lead having a first surface and a second surface opposite the first surface;

a plurality of solder joint connections that mechanically and electrically connect the first surfaces of selected leads with associated bond pads on the active surface of the die;

an adhesive film adhesively secured to second surfaces of the leads;

a viscous thermosetting material that substantially fills any gaps between the solder joint connections between the active surface of the die and the adhesive film, wherein the viscous thermosetting material, the solder joint connections, the active surface of the die and the adhesive film define a cavity between the active surface of the die and the adhesive film that isolates the sensitive region on the active surface of the die from stresses; and a molding material that encapsulates at least portions of the die, leads, solder joint connections and the adhesive film with a molding material, wherein the viscous thermosetting material, the active surface of the die and the adhesive film substantially prevent molding material from entering the cavity.

9. The integrated circuit package of claim 8, wherein the thickness of the adhesive film ranges between approximately 50 to 100 microns.

10. The integrated circuit package of claim 8, wherein the adhesive film is adapted to tolerate temperatures of at least approximately 250° C. without losing a substantial degree of adhesiveness.

11. The integrated circuit package of claim 8, wherein the viscosity of the thermosetting material is in the range of approximately 86 pascal-seconds to 90 pascal-seconds.

12. The integrated circuit package of claim 8, wherein portions of the non-active surface of the die and the leadframe are solder plated to facilitate electrical connections between the die and external devices.

13. The integrated circuit package of claim 8, wherein the molding material encapsulates the integrated circuit die without covering at least a portion of the non-active surface of the die, such that heat dissipation through the non-active surface of the die is facilitated.

14. The integrated circuit package of claim 8, wherein the pressure within the cavity is substantially less than the ambient pressure immediately outside the molding material.

* * * * *